United States Patent
Lunde et al.

(10) Patent No.: US 7,251,173 B2
(45) Date of Patent: Jul. 31, 2007

(54) COMBINATION COLUMN REDUNDANCY SYSTEM FOR A MEMORY ARRAY

(75) Inventors: Aron Lunde, Boise, ID (US); Michael Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 28 days.

(21) Appl. No.: 11/195,878

(22) Filed: Aug. 2, 2005

(65) Prior Publication Data

US 2007/0030742 A1    Feb. 8, 2007

(51) Int. Cl.
    *G11C 7/00*    (2006.01)
(52) U.S. Cl. ............. 365/200; 365/230.03; 365/230.06
(58) Field of Classification Search ............... 365/200, 365/230.03, 230.06, 230.02
    See application file for complete search history.

(56) References Cited

U.S. PATENT DOCUMENTS

| | | | |
|---|---|---|---|
| 5,231,604 A | 7/1993 | Watanabe | 365/189.05 |
| 5,548,553 A | 8/1996 | Cooper et al. | 365/200 |
| 6,084,807 A * | 7/2000 | Choi | 365/200 |
| 6,137,735 A | 10/2000 | Wei et al. | 365/200 |
| 6,301,164 B1 | 10/2001 | Manning et al. | 365/200 |
| 6,304,498 B1 * | 10/2001 | Ikeda | 365/200 |
| 6,331,956 B1 | 12/2001 | Ooishi et al. | 365/200 |
| 6,414,896 B1 * | 7/2002 | Kim et al. | 365/230.03 |
| 6,571,352 B2 | 5/2003 | Blodgett | 714/6 |
| 6,584,022 B2 | 6/2003 | Tsuji | 365/200 |
| 6,603,690 B1 | 8/2003 | Chen et al. | 365/200 |
| 6,665,220 B2 * | 12/2003 | Vlasenko | 365/200 |
| 6,668,345 B1 | 12/2003 | Ooishi et al. | 714/710 |
| 6,674,673 B1 | 1/2004 | Hsu et al. | 365/200 |
| 2002/0021600 A1 | 2/2002 | Tsuji | 365/200 |
| 2002/0113251 A1 | 8/2002 | Brady | 257/200 |
| 2002/0154553 A1 | 10/2002 | Shubat et al. | 365/200 |
| 2003/0067816 A1 | 4/2003 | Anand et al. | 365/200 |
| 2004/0109360 A1 | 6/2004 | Bateman et al. | 365/189.02 |
| 2004/0153899 A1 | 8/2004 | Batson et al. | 714/710 |
| 2005/0050400 A1 | 3/2005 | Wuu et al. | 714/42 |
| 2005/0141387 A1 | 6/2005 | Cernea et al. | 369/100 |

* cited by examiner

*Primary Examiner*—Gene N. Auduong
(74) *Attorney, Agent, or Firm*—Dorsey & Whitney, LLP (57) ABSTRACT

A column redundancy system combining at least two different redundancy systems to provide local redundant memory and shared redundant memory. The column redundancy system includes a plurality of sets of local redundant columns memory, each set of local redundant columns of memory is associated with a corresponding one of a plurality of memory sub-arrays. The columns of memory of the sets of local redundant columns of memory are adapted to replace defective columns of memory of the respective memory sub-arrays. The column redundancy system further includes columns of shared redundant memory that are adapted to replace defective columns of memory of the plurality of memory sub-arrays.

57 Claims, 5 Drawing Sheets

COMBINATION COLUMN REDUNDANCY SYSTEM FOR A MEMORY ARRAY

TECHNICAL FIELD

The invention relates generally to redundancy memory for a memory array, and more particularly, to a redundancy system for a memory array employing at least two different redundancy systems, one redundancy system providing local redundant memory and another redundancy system providing a shared redundant memory.

BACKGROUND OF THE INVENTION

Typical integrated memory devices include arrays of memory cells arranged in rows and columns. In many such memory devices, several redundant rows and columns are provided to replace malfunctioning memory cells found during testing. Testing is typically performed by having predetermined data values written to selected row and column addresses that correspond to memory cells. The memory cells are then read to determine if the data read matches the data written to those memory cells. If the read data does not match the written data, then those memory cells are likely to contain defects which will prevent proper operation of the memory device.

The defective memory cells may be replaced by enabling the redundant circuitry. A malfunctioning memory cell in a column or a row is substituted with a corresponding redundant element, such as an entire column or row of redundant memory cells, respectively. Therefore, a memory device need not be discarded even though it contains defective memory cells. Substitution of one of the redundant rows or columns is accomplished in a memory device by programming a specific combination of fuses, or if the memory device uses antifuses, by programming a specific combination of antifuses, located in one of several fuse or antifuses circuits in the memory device. Conventional fuses are resistive devices which may be opened or broken with a laser beam or an electric current. Antifuses are capacitive devices that may be closed or blown by breaking down a dielectric layer in the antifuse with a relatively high voltage. A set of fuses or antifuses is associated with each redundant element, and is programmed, or "blown," according to the address of the defective element the redundant element will replace.

When a row or column address received by the memory device matches one of the programmed addresses, the redundant element associated with the matching address is accessed instead of the row or column having the defective memory cells. In determining whether an address received by the memory device matches one of the programmed addresses, each incoming address is compared to the addresses programmed in the fuse or antifuse circuits. If a match is detected, then the corresponding redundant row or column is accessed, and the defective row or column is ignored, thus, remapping the memory address to the redundant element.

One conventional redundancy system is referred to as a "match and replace" redundancy system. In this system, the addresses of defective rows or columns of memory are programmed in antifuse banks, as previously described, and every address received by the memory device is compared with the programmed addresses. When one of the addresses is received by an address decoder, such as a column address received by a column address decoder, the column address is initially compared with the column addresses programmed in the antifuses. During this time, the column decoder is also decoding the column address in preparation to activate the original column of memory in the event the column address does not match one of the programmed column addresses (i.e., the current column address does not correspond to a defective column of memory). If, however, the column address matches one of the programmed column addresses, the defective column of memory corresponding to the column address is disabled and a redundant column that has been programmed to replace the defective column of memory is activated.

In a match and replace redundancy system, redundant column memory and original column memory are typically associated with a common input/output ("I/O") path. A time delay is added to every access operation in order to provide sufficient time to compare a current column address with the programmed addresses and determine if there is an address match. More importantly, if an address match is determined, there must be sufficient time to disable the defective column before activating the redundant column of memory. Without the time delay, if a current column address matches one of the programmed column addresses, the defective original column of memory corresponding to the current column address and the redundant column of memory replacing the defective column of memory would both be activated, causing the memory device to malfunction. Although the conventional match and replace redundancy system is simple to design and implement, the system presents a timing disadvantage by having a time delay added to every memory access operation. Where it is desirable for a memory device to provide data with relatively fast access times, the additional time delay added to each memory access may be unacceptable.

One approach that has been developed to avoid the time delay of the conventional match and replace redundancy system is referred to as an I/O multiplexing redundancy system. The I/O multiplexing redundancy system includes redundant memory, such as redundant column memory, for each "redundancy plane." However, a dedicated set of I/O lines is included for each of the associated redundant memory in addition to the I/O lines for the array of normal memory of a redundancy plane. As with the conventional match and replace redundancy system, the addresses corresponding to defective columns of memory are programmed in antifuse banks. The time delay is avoided by having both the normal column of memory and the redundant column of memory corresponding to a current column address coupled respective sets of I/O lines. The two sets of I/O lines are provided to a multiplexer that is used to select which set of I/O lines to use to couple to an I/O bus. Where a defective column of memory has been remapped to a redundant column of memory, a column address decoder controls the multiplexer to couple the set of I/O lines dedicated to the redundant memory to the I/O bus. The set of I/O lines for the normal memory array, in contrast, are ignored and are not coupled to the I/O bus. By the time each of the columns of the normal memory array and the redundant memory are coupled to the respective sets of I/O lines, the multiplexer has already, or immediately thereafter, coupled the appropriate set of I/O lines to the I/O bus. As a result, a time delay is unnecessary for every access operation. Additionally, the I/O lines for the redundant columns of memory can have less loading, and consequently, the redundant columns of memory may be activated later than the normal columns of memory and still provide data to the multiplexer in time to avoid any additional delays.

Although the I/O multiplexing redundancy system eliminates the need for including a time delay, the extra set of I/O lines requires considerable space on the semiconductor die on which the memory device is formed. As previously discussed, a set of I/O lines are provided for each array of redundant memory associated with a redundancy plane. Typically, a redundancy plane is related to the data prefetch architecture of a memory device, with each data prefetch region of the memory array having its own set of redundancy memory. As memory devices evolve to data prefetch architectures having greater data prefetch numbers in order to improve output data bandwidth, using an I/O multiplexing redundancy system will require a greater number of additional I/O lines and consequently, require more space on the semiconductor die. Where space on the semiconductor die on which the memory device is formed, use of the I/O multiplexing redundancy scheme is undesirable. Additionally, the use of an I/O multiplexing redundancy system for memory devices having greater data prefetch architectures is not practical in such circumstances.

Another redundancy system that has been developed to reduce or eliminate the time delay of conventional match and replace redundancy system utilizes redundant elements physically located at the periphery of a redundancy domain that are utilized by "shifting" the decoding of memory addresses "up" or "down" to avoid defective memory elements. A redundancy domain includes a limited number of redundancy elements allocated for the defective memory of a region of memory. For example, with respect to column redundancy, when a defective column of memory is identified, the defective column is ignored by shifting all of the column addresses over by one column, and utilizing a column of redundant memory at the periphery. Thus, the address of the defective column is now remapped to an adjacent column of memory. Shortcomings of this redundancy system include sacrificing considerable space on the die of the memory device to include the logic circuits and address decoding circuitry necessary to remap shifted memory addresses. Additionally, this redundancy system lacks flexibility because the allocation of redundant elements for each redundancy domain is limited by the complexity of the supporting logic. Including more redundant column memory to improve flexibility is an undesirable option as well since this results in the complexity and size of the column decoders to increase significantly.

Therefore, there is a need for an alternative redundancy system that provides flexibility in design and can be practically implemented in current and later memory device architectures.

SUMMARY OF THE INVENTION

The present invention is directed to a column redundancy system combining at least two different redundancy systems to provide local redundant memory and shared redundant memory. In one aspect of the invention, a column redundancy system for a memory array having a plurality of memory sub-arrays including memory cells arranged in rows and columns of memory is provided. The column redundancy system includes a plurality of sets of local redundant columns memory. Each set of local redundant columns of memory is associated with a corresponding one of the plurality of memory sub-arrays, and the columns of memory of the sets of local redundant columns of memory are adapted to replace defective columns of memory of the respective memory sub-arrays. The column redundancy system further includes shared redundant memory having memory cells arranged in rows and columns of memory. The columns of memory of the shared redundant memory are adapted to replace defective columns of memory of the plurality of memory sub-arrays.

DETAILED DESCRIPTION OF PREFERRED EMBODIMENTS

Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
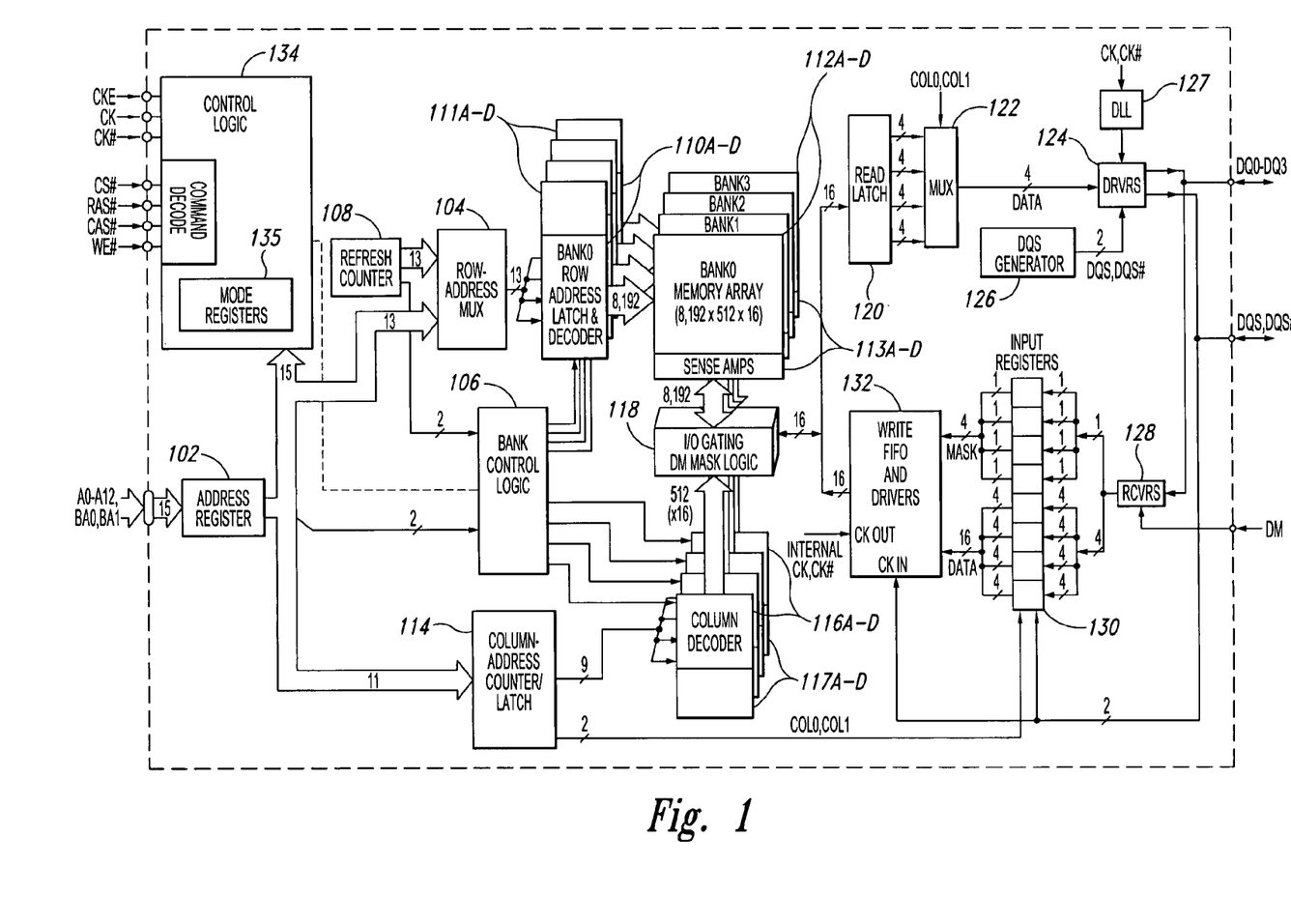
FIG. 1 is a functional block diagram illustrating a synchronous memory device having a redundancy system according to an embodiment of the present invention.

FIG. 1 illustrates a memory device 100 in which an embodiment of the present invention can be implemented. The memory device 100 in FIG. 1 is a double-data rate ("DDR") SDRAM. The memory device 100 is referred to as a double-data-rate device because the data words being transferred to and from the memory device 100 are transferred at double the rate of a conventional SDRAM, which transfers data at a rate corresponding to the frequency of the applied clock signal. The memory device 100 includes a control logic and command decoder 134 that receives a plurality of command and clocking signals over a control bus, typically from an external circuit such as a memory controller (not shown). The command decoder 134 includes a mode register 135 that can be programmed to set various modes of operation of the memory device 100. The command signals include a chip select signal CS#, a write enable signal WE#, a column address strobe signal CAS#, and a row address strobe signal RAS#, while the clocking signals include a clock enable signal CKE# and complementary clock signals CLK, CLK#, with the "#" designating a signal as being active low. The command signals CS#, WE#, CAS#, and RAS# are driven to values corresponding to a particular command, such as a read, write, or auto-refresh command.

In response to the clock signals CLK, CLK#, the command decoder 134 latches and decodes an applied command, and generates a sequence of clocking and control signals for control components 102–132 to execute the function of an applied command. The clock enable signal CKE enables clocking of the command decoder 134 by the clock signals CLK, CLK#. The memory device 100 further includes an address register 102 that receives row, column, and bank addresses over an address bus, with a memory controller (not shown) typically supplying the addresses. The address register 102 receives a row address and a bank address that are applied to a row address multiplexer 104 and bank control logic circuit 106, respectively. The row address multiplexer 104 applies either the row address received from the address register 102 or a refresh row address from a refresh counter 108 to a plurality of row address latch and decoders 110A–D. The bank control logic 106 activates the row address latch and decoder 110A–D corresponding to either the bank address received from the address register 102 or a refresh bank address from the refresh counter 108, and the activated row address latch and decoder latches and decodes the received row address. Row antifuse bank 111A–D includes a set of antifuses that can be programmed with the addresses of the defective rows of the respective bank of memory 112A–D.

The row address latched by the activated row address latch and decoder 110A–D is decoded and the activated row address latch and decoder 110A–D applies various signals to a corresponding memory bank 112A–D to thereby activate the appropriate row of memory in response to the decoded row address and in accordance with the row redundancy system utilized to repair defective rows of memory. Each memory bank 112A–D includes a memory-cell array having a plurality of memory cells arranged in rows and columns, and the data stored in the memory cells in the activated row is latched by respective sense amplifiers 113A–D in the corresponding memory bank. The row address multiplexer 104 applies the refresh row address from the refresh counter 108 to the decoders 110A–D. The bank control logic circuit 106 uses the refresh bank address from the refresh counter when the memory device 100 operates in an auto-refresh or self-refresh mode of operation in response to an auto- or self-refresh command being applied to the memory device 100, as will be appreciated by those skilled in the art.

A column address is applied on the address bus after the row and bank addresses, and the address register 102 applies the column address to a column address counter and latch 114 which, in turn, latches the column address and applies the latched column address to a plurality of column decoders 116A–D. Column antifuse circuits 117A–D include sets of antifuses that can be programmed with the address of the defective columns of memory. The bank control logic 106 activates the column decoder 116A–D corresponding to the received bank address, and the activated column decoder decodes the applied column address. The column address is decoded and the appropriate columns of memory are activated in accordance with the programming of the antifuses in the column antifuse circuits 117A–D and the column redundancy system used for column memory repair. The memory device 100 includes a column redundancy system in accordance with an embodiment of the present invention, as will be explained in more detail below.

Depending on the operating mode of the memory device 100, the column address counter and latch 114 either directly applies the latched column address to the decoders 116A–D, or applies a sequence of column addresses to the decoders starting at the column address provided by the address register 102. In response to the column address from the counter and latch 114, the activated column decoder 116A–D applies decode and control signals to an I/O gating and data masking circuit 118 which, in turn, accesses memory cells corresponding to the decoded column address in the activated row of memory cells in the memory bank 112A–D activated in response to the decoded row address.

During a data read command, data is read from the addressed memory cells and coupled through the I/O gating and data masking circuit 118 to a read latch 120. The I/O gating and data masking circuit 118 supplies N bits of data to the read latch 120, which then applies four N/4 bit words to a multiplexer 122. The memory device 100 has a "4n" prefetch architecture, where four sets of n-bit wide data are retrieved for each memory access. The memory device 100 is shown in FIG. 1 as a "x4" memory device, providing and receiving 4-bit wide data in response to each clock edge of the CLK and CLK# signals, as will be explained in more detail below. Since the memory device has a 4n prefetch architecture, and is a x4 data width, the circuit 118 provides 16 bits to the read latch 120 which, in turn, provides four 4-bit words to the multiplexer 122. A data driver 124 sequentially receives the N/4 bit words DATA from the multiplexer 122 and also receives a data strobe signal DQS from a strobe signal generator 126 and a delayed clock signal CLKDEL from the delay-locked loop ("DLL") 127. The DQS signal is used by an external circuit such as a memory controller (not shown) for synchronizing receipt of read data during read operations. In response to the delayed clock signal CLKDEL, the driver circuits of the I/O buffer 124 sequentially output the received DATA on data terminals DQ0–DQ3 as a corresponding data word. Each data word is output onto a data bus in synchronism with rising and falling edges of a CLK signal that is applied to clock the memory device 100. The data driver 124 also outputs the data strobe signal DQS having rising and falling edges in synchronism with rising and falling edges of the CLK signal, respectively.

During data write operations, an external circuit such as a memory controller (not shown) applies N/4 bit data words to the data terminals DQ0–DQ3, the strobe signal DQS, and corresponding data masking signals DM on the data bus. A data receiver 128 receives each data word and the associated DM signals, and applies these signals to input registers 130 that are clocked by the DQS signal. In response to a rising edge of the DQS signal, the input registers 130 latch a first N/4 bit data word and the associated DM signals, and in response to a falling edge of the DQS signal the input registers latch the second N/4 bit data word and associated DM signals. The input register 130 provides the four latched N/4 bit data words as an N-bit word to a write FIFO and driver 132, which clocks the applied data word and DM signals into the write FIFO and driver in response to the DQS signal. The data word is clocked out of the write FIFO and driver 132 in response to the CLK signal, and is applied to the I/O gating and masking circuit 118. The I/O gating and masking circuit 118 transfers the data word to the addressed memory cells in the accessed bank 112A–D subject to the DM signals, which may be used to selectively mask bits or groups of bits in the data words (i.e., in the write data) being written to the addressed memory cells.

Figure 2:
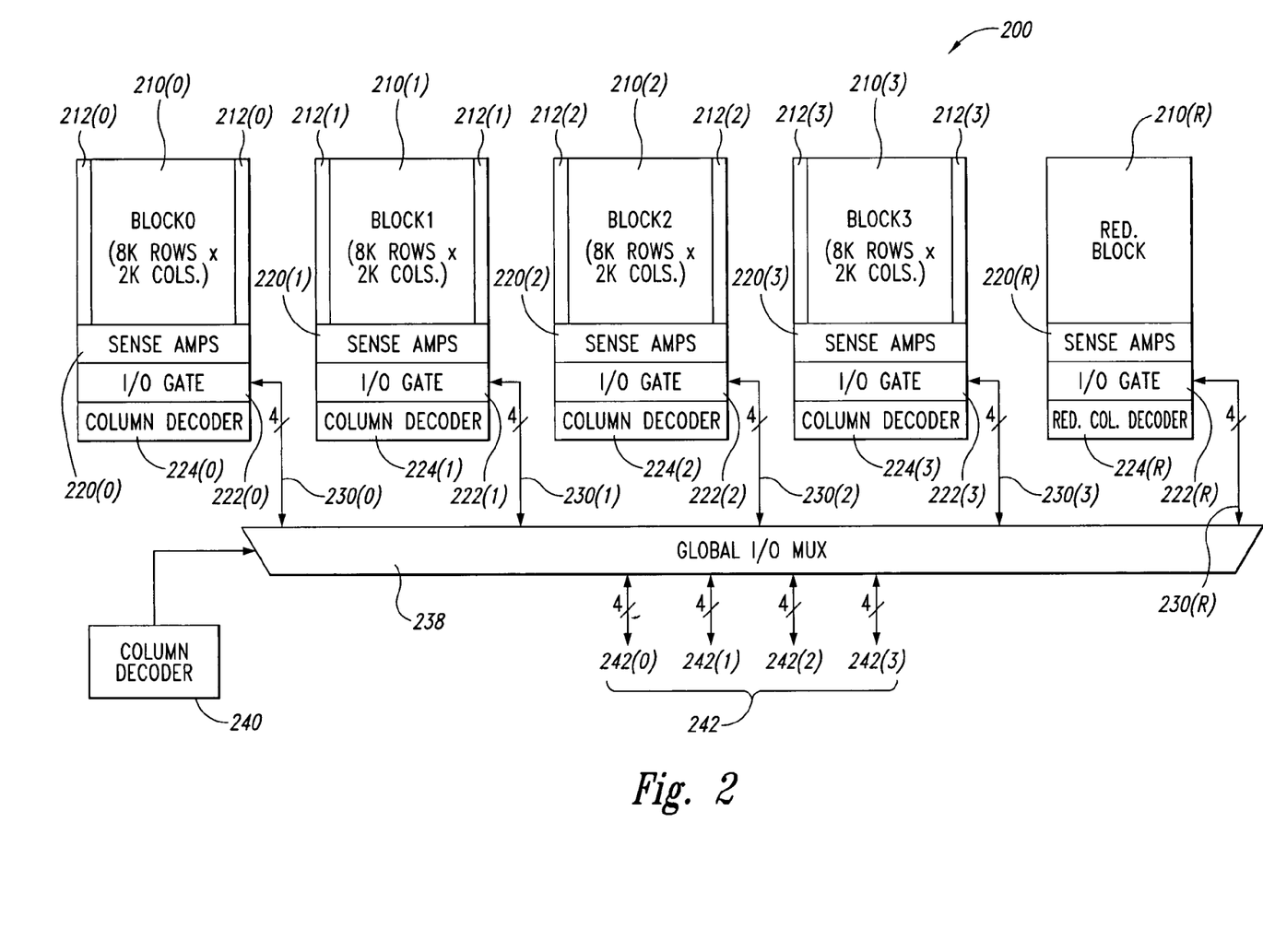
FIG. 2 is a functional block diagram of a redundancy system according to an embodiment of the present invention.

FIG. 2 illustrates a column redundancy system 200 according to an embodiment of the present invention. A memory bank 112 of FIG. 1 is shown in FIG. 2 as four different blocks of memory 210(0)–210(3). Only one memory bank 112 is shown in FIG. 2, although the same partitioning into four blocks of memory is applied to the other memory banks 112 of the memory device 100. In the present example, the memory bank 112 is divided into four logical blocks of memory 210(0)–210(3) since the memory device 100 (FIG. 1) has a 4n prefetch architecture, where "n" represents the bit-width of the data output of the memory device 100, as previously described. Generally, each block of memory 210(0)–210(3) provides one group of the n-bit wide data. For the 64 Mbit×4 arrangement of FIG. 1, n=4 provides a total of 16-bits of data for each access. The specific example described herein has been provided for the benefit of facilitating the understanding of the invention. However, it will be appreciated that the scope of the present invention is not limited to any particular logical arrangement of memory, and that embodiments of the present invention can be utilized with memory having alternative logical arrangements.

As shown in FIG. 1, each bank of memory 112 has a total of 64 Mbits addressable memory cells arranged as 16 sub-arrays that are each 8,192 rows by 512 columns. Each of the blocks of memory 210(0)–210(3) corresponds to four sub-arrays and is arranged as 8,192 rows by 2,048 columns of addressable memory cells. Each memory block 210(0)–210(3) includes a respective set of local redundant column memory 212(0)–212(3). As will be explained in more detail below, the redundant column 212(0)–212(3) are used in a column decode shifting redundancy scheme for each block of memory 210(0)–210(3). As will be further described below, the column decode shifting redundancy scheme will be combined with another column redundancy scheme to address the issues previously described with respect to using only the column decode shifting redundancy scheme for repair. As previously discussed, typical column decode shifting redundancy schemes include very limited number of redundant column memory that are utilized by "shifting" the column address decoding from the defective column of memory to adjacent columns of memory including the redundant column memory. Each memory block 210(0)–210(3) is shown with redundant column memory 212(0)–212(3) at opposite sides of the memory block to provide shift "up" and shift "down" options to replace defective columns of memory. The number of columns that are included when shifting either up or down for repair can vary, depending on the particular memory design. For example, in one design, each repair shift can shift the columns by one column. In another design, the columns are shifted over two columns for each repair shift. In other designs, each repair shift can shift the columns by four or eight columns.

Sense amplifiers 220(0)–220(3) are coupled to the columns of memory of the blocks of memory 210(0)–210(3) to amplify and latch the stored data states for a row of memory selected by a corresponding row address provided to the memory device 100, as previously discussed. In the present example, the sense amplifiers 220(0)–220(3) represent a total of 8,192 sense amplifiers, plus the sense amplifiers for the redundant column memory 212(0)–212(3). Column decoders 224(0)–224(3) select which of the sense amplifiers are to be coupled to four-bit wide input/output ("I/O") lines 230(0)–230(3) through the I/O gates 222(0)–222(3) according to a column address. That is, four bits of data from each block of memory 210(0)–210(3) are coupled to the I/O lines 230(0)–230(3) to provide a total of 16 bits of data through global I/O multiplexer 238 to a 16-bit wide I/O bus 242. As shown in FIG. 2, the I/O bus 242 has four 4-bit portions 242(0)–242(3), each corresponding to a respective block of memory 210(0)–210(3). The I/O bus 242 is coupled to the read latch 120 and the write FIFO 132, as shown in FIG. 1. Where the redundant column memory 212(0)–212(3) has been utilized to replace defective columns of memory, the column decoders 224(0)–224(3) couple the functional columns of memory in accordance with the programming of the column antifuses of the antifuse banks 117 (FIG. 1).

In addition to the redundant column memory 212(0)–212(3), the column redundancy system 200 includes a block of redundant column memory 210(R) that is shared by the blocks of memory 210(0)–210(3). In one embodiment, the block of redundant column memory 210(R) has the same row dimensions as the blocks of memory 210(0)–210(3). In the present example, the redundant column memory is arranged as 8,192 rows by N columns of addressable memory cells, where N is a non-zero number. However, a block of redundant column memory having other array dimensions can be used as well. Unlike conventional "match and replace" redundant column memory, as previously discussed, the block of redundant column memory 210(R) includes sense amplifiers 220(R), I/O gate 222(R), and redundancy column decoder 224(R) for coupling to a dedicated set of n-bit-wide I/O lines 230(R). As with the I/O lines 230(0)–230(3), the I/O lines 230(R) are coupled to the global I/O multiplexer 238. A column decoder 240 controls the global I/O multiplexer 238 to select four sets of I/O lines from the I/O lines 230(0)–230(3) and 230(R) to be coupled to the I/O bus 242 to provide an I/O multiplexer redundancy scheme. As with the redundant column memory 212(0)–212(3), when column memory of the redundant block of memory 210(R) is utilized, the column decoder 240 selects the I/O lines 230(R) and does not select the I/O lines corresponding to the block of memory having the failing column memory in accordance with the programming of the antifuses in the antifuse bank 117. In the present embodiment, the logical arrangement of the blocks of memory 210(0)–210(3) and the block of redundant memory 210(R) are the same. As a result, once the redundant memory of the block of redundant memory 210(R) for a column address is used, the same address cannot be repaired for any other block of memory 210(0)–210(3) using the block of redundant memory 210(R).

Generally, the four columns of memory that are coupled to the respective I/O lines 230(0)–230(3) of each block of memory 210(0)–210(3) for a column address are all roughly physically located at the same relative position within the respective block of memory. For example, if a column address corresponds to four columns of memory physically located at a location on the left-side of the block of memory 210(0), typically, the same column address corresponds to four columns of memory physically located at the same location on the left-side of the block of memory 210(1), 210(2), and 210(3). In an embodiment of the present invention, the physical location of the columns of memory corresponding to a column address is located at the same relative location as for the blocks of memory 210(0)–210(3).

Although the blocks of memory 210(0)–210(3) have been shown as separate functional blocks, the arrangement of a bank of memory 112 into four blocks of memory 210(0)–210(3) and a block of redundant column memory 210(R) has been made for the purpose of simplifying the description of an example of the invention. It will be appreciated that the banks of memory 112 (FIG. 1) are not physically divided into blocks of memory 210(0)–210(3) and 210(R) as shown in FIG. 2. Additionally, the sense amplifiers 210(0)–210(3), I/O gates 222(0)–222(3) and global I/O multiplexer 238, the column decoders 224(0)–224(3) and 240 have been illustrated as different functional blocks for a similar purpose. Generally, the sense amplifiers 210(0)–210(3) and 210(R) are represented by the sense amplifiers 113, the I/O gates 222(0)–222(3) and global I/O multiplexer 238 represented by the I/O gating 118, and the column decoders 224(0)–224(3) and 240 represented by the column decoders 116, all with respect to FIG. 1.

Figure 3:
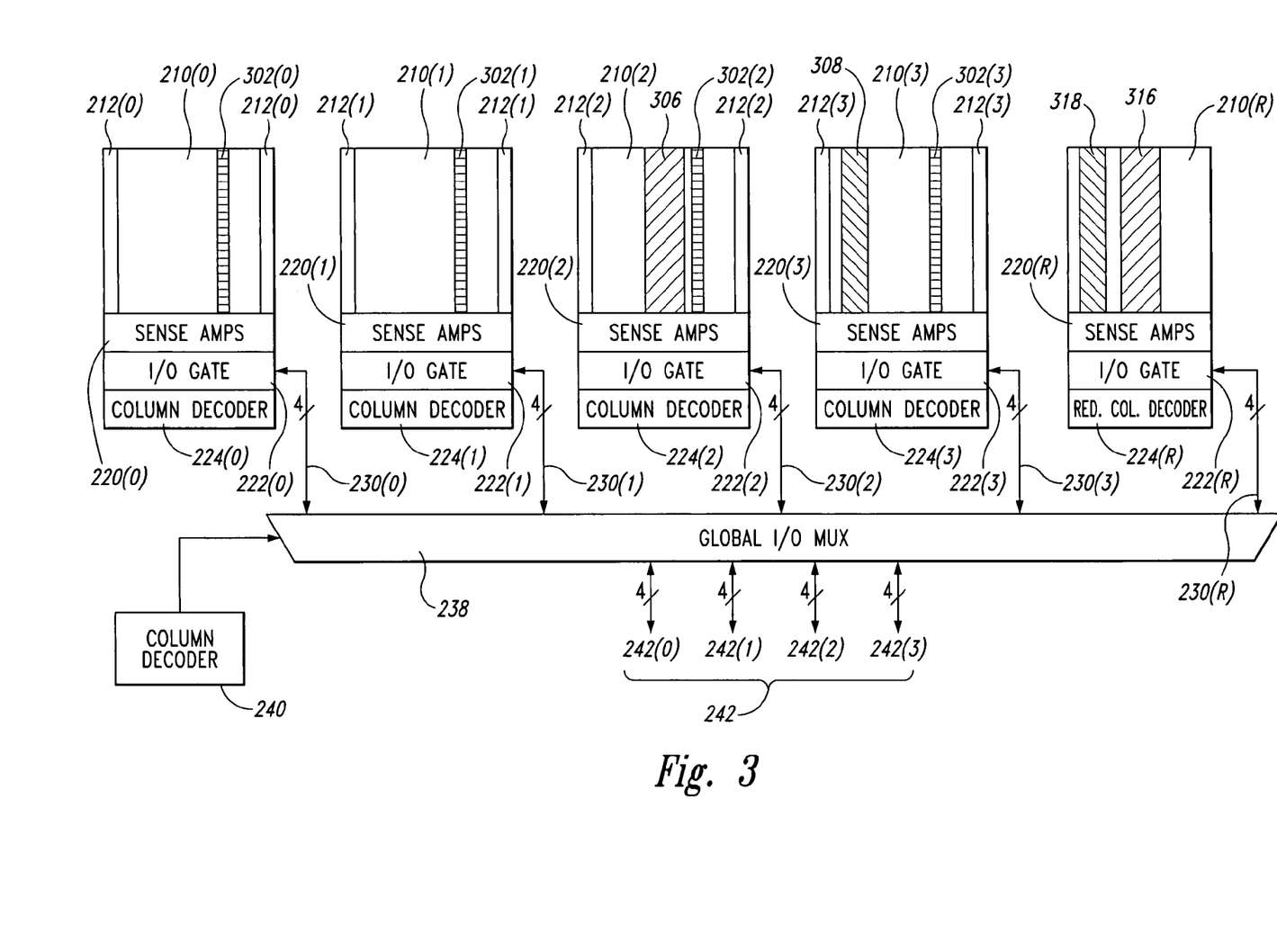
FIG. 3 is a functional block diagram of the redundancy system of FIG. 2 utilized to replace defective columns of memory.

Operation of the column redundancy system 200 will be described with reference to FIG. 3. In the example shown in FIG. 3, the blocks of memory 210(0)–210(3) each have a defective column of memory 302(0)–302(3) each at the same address in each block of memory, respectively. Antifuses of the antifuse bank 117 have been programmed so that the column addresses corresponding to the defective columns of memory 302(0)–302(3) are remapped for each of the blocks of memory 210(0)–210(3) by shifting the column decoding to the "right" to utilize the redundant column memory 212(0)–212(3) on the right side of each block of memory 210(0)–210(3). The block of memory 210(2) further has a group of defective columns 306. The column addresses corresponding to the group of defective columns 306 have been remapped to the group of redundant column memory 316 located in the block of redundant column memory 210(R) by programming the antifuses of the antifuse bank 117. The block of memory 210(3) also has a group of defective column memory 308. The column addresses corresponding to the group of defective column memory 308 have been remapped to the group of redundant column memory 318 of the block of redundant column memory 210(R).

In operation, as previously discussed, a row address (and a bank address) provided to the memory device 100 is decoded, and the row of memory corresponding to the address is activated. With respect to FIG. 3, when a row of memory is activated for the bank of memory having the blocks of column memory 210(0)–210(3) and 210(R), the row extends across all of the blocks of column memory 210(0)–210(3) and 210(R). In response to activating the row of memory, the data stored by the memory cells are coupled to respective column lines (not shown), which are in turn coupled to a respective sense amplifier to amplify the stored data. In the present arrangement of memory, when a row of memory is activated, a total of 8,192 memory cells are coupled to a respective column line, and 8,192 sense amplifiers amplify and latch the respective data. Additionally, the memory cells of the redundant column memory 212(0)–212(3) and of the block of redundant memory 210(R) for the activated row are also coupled to a respective column line and sense amplifier. As will be explained in more detail below, which of the amplified and latched data of the memory cells of the redundant column memory 212(0)–212(3) and of the block of redundant memory 210(R) that are coupled to the respective I/O lines 230(0)–230(3) and 230(R) will depend on whether any of the redundant column memory 212(0)–212(3) and of the block of redundant memory 210(R) are used to replace defective columns of memory, as determined by the programming of the antifuses in the antifuse bank 117.

Following amplification and latching of the data of the memory cells for the activated row of memory, the column decoders 224(0)–224(3) and the redundancy column decoder 224(R) decode a column address which is received by the memory device 100 subsequent to the row address. Based on the column address, the column decoders 224(0)–224(3) select which of the sense amplifiers to couple to the respective I/O lines 230(0)–230(3) and 230(R). For each column address, a total of 16-bits of data are coupled through the global I/O multiplexer 238 to the I/O bus 242. Each block of memory 210(0)–210(3) and 210(R) provides five groups of 4-bit of data for a total of 20-bits to the global I/O multiplexer 238. Which four of the five groups of 4-bit data is coupled will depend on whether the column address corresponds to any columns of memory that have been remapped to redundant column memory in the block of column memory 210(R).

In the event that the column address provided to the memory device 100 corresponds to the defective columns of memory 302(0)–302(3), which was previously described as being remapped to respective redundant column memory 212(0)–212(3) by shifting the column decode by one column of memory to the right, the column decoders 224(0)–224(3) couple the columns of memory immediately adjacent to the right of the defective columns of memory 302(0)–302(3) to the respective I/O lines 230(0)–230(3). In this manner, the defective columns of memory 302(0)–302(3) are ignored. The data of the immediately adjacent columns of memory coupled to the respective I/O lines 230(0)–230(3) are provided to the global I/O multiplexer 238. While the 4-bits of data from the blocks of memory 210(0)–210(3) are being coupled to the global I/O multiplexer 238, 4-bits of data from the block of redundant memory 210(R) are coupled to the global I/O multiplexer 238 as well. Although five groups of 4-bits of data are provided to the global I/O multiplexer 238, the column decoder 240 selects the I/O lines 230(0)–230(3) to be coupled to the I/O bus 242 since the defective columns of memory are repaired using the local redundant columns of memory 212(0)–212(3). Thus, the 4-bits of data provided by the block of redundant column memory 210(R) to the global I/O multiplexer 238 are not coupled to the I/O bus 242.

In the following example, the column address provided to the memory device 100 corresponds to columns of memory in the range of the group of defective column memory 306 for the block of memory 210(2). Four columns of memory that correspond to the current column address for each of the blocks of memory 210(0)–210(3) are coupled to the respective I/O lines 230(0)–230(3). Each block of memory 210(0)–210(3) provides 4-bits of data. Additionally, four columns of memory of the block of redundant column memory 210(R) that are located in the group of redundant column memory 316 are also coupled to the I/O lines 230(R) to provide 4-bits of data. As in the previous example, five groups of 4-bits of data are coupled to the global I/O multiplexer 238. More specifically, three of the groups from the columns of memory of the blocks of memory 210(0), 210(1), and 210(3), one group from the defective columns of memory 306 of the block of memory 210(2), and one group from the redundant columns of memory 316 of the block of redundant memory 210(R). The column decoder 240, due to the programming of the antifuses in the antifuse bank 117 to remap the defective columns of memory 306 to the redundant columns of memory 316, selects the I/O lines 230(0), 230(1), 230(3), and 230(R) to be coupled to the portions of the I/O bus 242(0), 242(1), 242(3), and 242(2), respectively. Although four columns of the defective columns of memory 306 were coupled to the I/O lines 230(2), the data is ignored by not coupling the I/O lines 230(2) to the portion of the I/O bus 242(2), and instead, the I/O lines 230(R) are coupled to the portion of the I/O bus 242(2).

Similarly, in the event that a column address received by the memory device 100 corresponds to columns of memory that are in the defective columns of memory 308 of the block of memory 210(3), the column decoder 240 will control the global I/O multiplexer 238 to couple the I/O lines 230(0), 230(1), 230(2), and 230(R) to the I/O bus 242, and ignore the I/O lines 230(3). Thus, the columns in the defective columns of memory 308 are ignored and column address for the block of memory 210(3) is remapped to corresponding redundant columns of memory 318 in the block of redundant memory 210(R).

In addition to the column decoder 240 being configured to couple the appropriate I/O lines 230(0)–230(3) and 230(R)

to the I/O bus 242, the column decoder is further configured to couple the selected I/O lines 230(0)–230(3) and 230(R) in the appropriate arrangement to the I/O bus 242 for repairing the targeted defective column among the four. The I/O multiplexer, under the control of the column decoder 240, can couple the I/O lines 230(R) to the I/O bus 242 to provide the 4-bits of data from the block of redundant columns of memory 210(R) as the first 4-bits of data, the second 4-bits of data, the third 4-bits of data, or the fourth 4-bits of data on the I/O bus 242. In this manner, the block of redundant columns of memory 210(R) can be used to replace defective columns of memory from any of the four blocks of memory 210(0)–210(3). Suitable column decoders 240 and global I/O multiplexers 238 are currently known, and can be designed using conventional circuits well understood by those ordinarily skilled in the art.

As illustrated by the previous examples, the two different types of redundancy systems provided in the column redundancy system 200 are utilized in combination with one another. Each of the blocks of memory 210(0)–210(3) include respective dedicated redundant columns of memory 212(0)–212(3) that are utilized through column decode shifting. Additionally, the block of redundant memory 210(R) having its own set of I/O lines 230(R) is shared by all of the blocks of memory 210(0)–210(3) to replace defective columns of memory. However, the block of redundant memory 210(R) can be used to replace defective columns of memory of more than one block of memory to the extent that the defective columns of memory of one block of memory are not located in the same relative location as the defective columns of memory for the other block of memory. That is, if more than one block of memory 210(0)–210(3) has defective columns of memory corresponding to the same column address, the block of redundant memory 210(R) cannot be used to repair the same defective columns of memory in each of the blocks of memory. As previously discussed, the logical arrangement of the blocks of memory 210(0)–210(3) are the same, including the block of redundant memory 210(R). As a result, once the redundant memory of the block of redundant memory 210(R) for a column address is used, the same address cannot be repaired for any other block of memory using the block of redundant memory 210(R). Although the shared block of redundant memory 210(R) has this limitation, the use of the dedicated redundant columns 212(0)–212(3) mitigate any significant impact on the ability to repair memory arrays for typical failure modes of columns of memory having the same column addresses.

Figure 4:
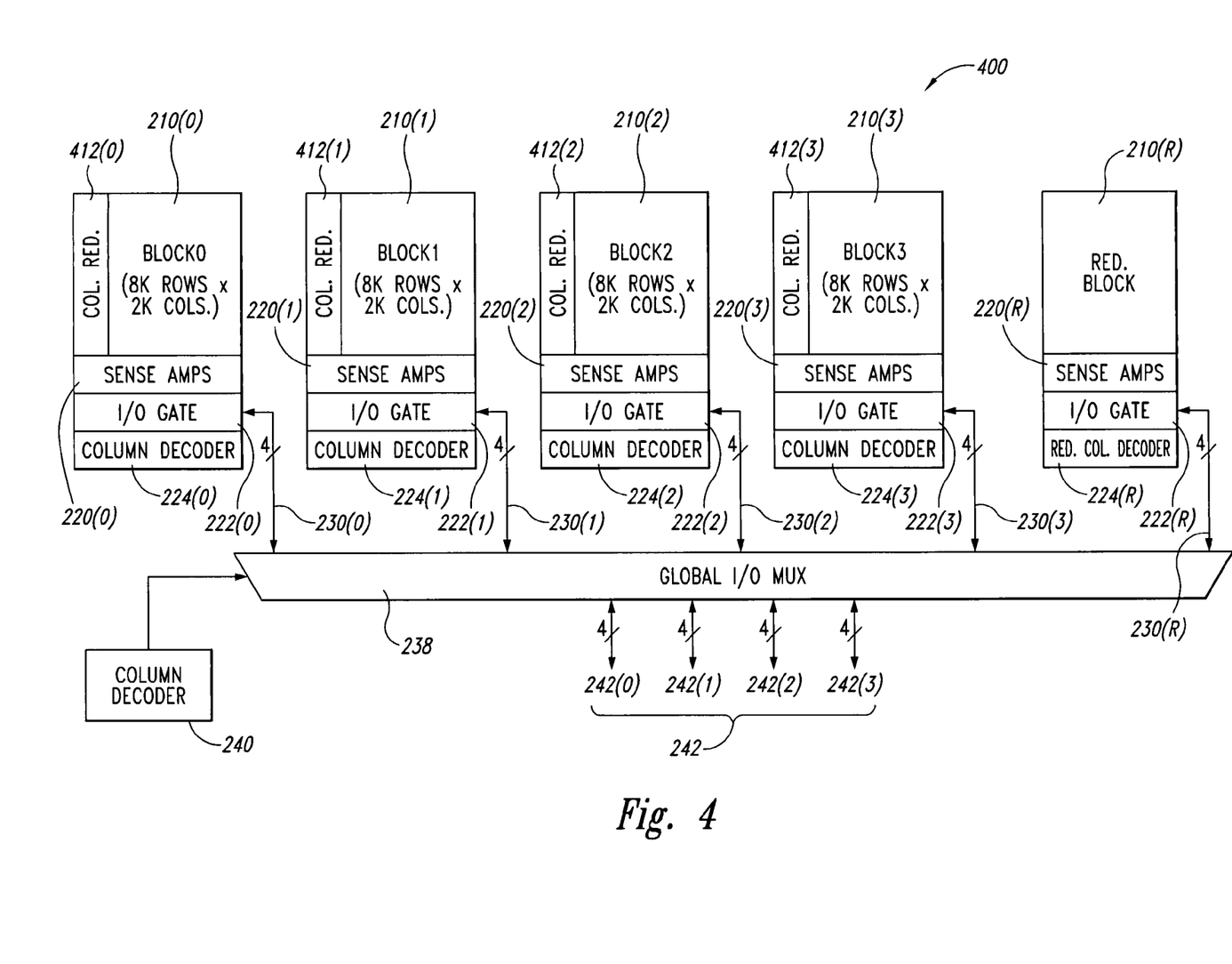
FIG. 4 is a functional block diagram of a redundancy system according to an alternative embodiment of the present invention.

FIG. 4 illustrates a column redundancy system 400 according to another embodiment of the present invention. Functional blocks previously described with respect to the column redundancy system 200 of FIG. 2 that are common with the column redundancy system 400 are referenced in FIG. 4 using the same reference numbers. As with FIG. 2, a memory bank 112 partitioned into four blocks of memory 210(0)–210(3). Sense amplifiers 220(0)–220(3) are coupled to the columns of memory in the blocks of memory 210(0)–210(3), and I/O gates 222(0)–222(3) couple selected sense amplifiers of the sense amplifiers 220(0)–220(3) to respective I/O lines 230(0)–230(3) in accordance with a column address decoded by column decoders 224(0)–224(3). The respective I/O lines 230(0)–230(3) are coupled to a global I/O multiplexer 238, which couples the I/O lines to an I/O bus 242 under the control of column decoder 240. Thus far, the column redundancy system 400 is similar to the column redundancy system 200. In contrast, however, the column redundancy system 400 includes local redundant column memory 412(0)–412(3) that are utilized in a match and replace column redundancy scheme. As previously discussed, the column redundancy system 200 included redundant column memory 212(0)–212(3) that was utilized in a column decode shifting redundancy scheme. The redundant column memory 412(0)–412(3) includes a plurality of redundant column memory that can be used to replace defective column memory in the associated block of memory 210(0)–210(3). Column addresses of defective column memory are remapped to the respective redundant column memory by programming the column addresses using antifuses in the antifuse banks 117 (FIG. 1), as known in the art. When the memory device receives a column address that matches a programmed column address, the column decoder accesses the redundant column of memory instead of accessing the defective column of memory. Thus, the defective column of memory is ignored.

In addition to the redundant columns of memory 412(0)–412(3), the column redundancy system 400 includes a block of redundant columns of memory 210(R). As with the column redundancy system 200, the block of redundant columns of memory 210(R) includes sense amplifiers 220(R), I/O gate 222(R), and redundancy column decoder 224(R) for coupling to a respective set of I/O lines 230(R). The I/O lines 230(R) are coupled to the global I/O multiplexer 238 for coupling to the I/O bus 242 if one or more column addresses are mapped to redundant column memory in the block of redundant column memory 210(R).

Operation of the column redundancy system 400 is similar to the operation of the column redundancy system 200, as previously described. Defective columns of memory in the blocks of memory 210(0)–210(3) can be repaired locally using the redundant columns of memory 412(0)–412(3), in which case, the column decoders 224(0)–224(3) couple selected sense amplifiers to the respective I/O lines 230(0)–230(3), which are in turn coupled to the I/O bus 242 through the global I/O multiplexer 238 under the control of the column decoder 240. However, if defective column memory of one or more of the blocks of memory 210(0)–210(3) have been repaired by using redundant column memory of the block of redundant memory 210(R), in response to decoding the column address corresponding to the defective column, the column decoder 240 will select the I/O lines 230(R) to be coupled to the I/O bus 242 instead of the I/O lines associated with the block of memory 210(0)–210(3) having the defective columns of memory.

The utilization of the redundant column memory of the block of redundant columns of memory 210(R) is limited as previously discussed with respect to the column redundancy system 200. That is, although the block of redundant columns of memory 210(R) can be used to repair defective columns of memory for more than one block of memory 210(0)–210(3), this is only to the extent that the defective columns of memory each block of memory 210(0)–210(3) do not correspond to the same column address. In the event that more than one block of memory 210(0)–210(3) has defective columns of memory for the same column address, the redundant columns of memory 412(0)–412(3) will need to be used to repair the defective columns of memory.

As with the column redundancy system 200, the column redundancy system 400 includes more than one type of redundancy scheme for repairing defective columns of memory of the blocks of memory 210(0)–210(3). A match and replace redundancy scheme is combined with the block of redundant columns of memory 210(R) in the column redundancy system 400. As previously discussed, each of the different redundancy schemes has advantages, as well as disadvantages. In embodiments of the present invention, at least two different redundancy schemes are used together for repairing defective columns of memory. One benefit of including more than one type of redundancy mechanism is the ability to tailor the type of redundant column memory included on a memory device in order to provide more efficient use of space.

For example, in a memory device architecture having increased prefetch design, such as a 4n or greater prefetch, having a shared block of redundant memory that includes a separate set of I/O lines can conserve die area since several blocks of memory can share a single redundant array, rather than providing each block with a redundant array having dedicated I/O lines. Although each block of memory does include dedicated, local redundant columns of memory to be used with a shared redundant block of memory, the quantity of dedicated local redundant memory can be scaled back in comparison to what would otherwise be needed to maintain the same yield using a column redundancy system having only local redundant columns of memory. The use of the scaled down quantity of local redundant memory can be used to repair column defects that affect the same column of memory in each of the blocks of memory, thus overcoming the shortcomings of using only a shared block of redundant memory for repairing defective columns of memory.

Figure 5:
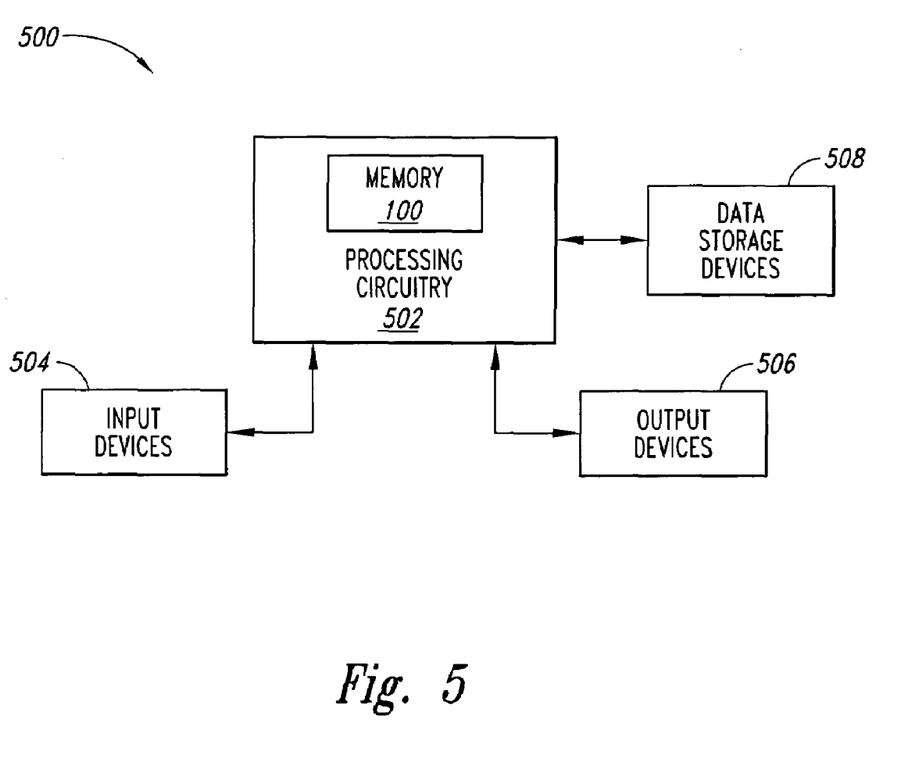
FIG. 5 is a functional block diagram illustrating a computer system including the synchronous memory device of FIG. 1.

FIG. 5 illustrates a processing system 500 having processing circuitry 502 including the memory device 100 of FIG. 1. Typically, the processing circuitry 502 is coupled through address, data, and control buses to the memory device 100 to provide for writing data to and reading data from the memory device. The processing circuitry 502 includes circuitry for performing various processing functions, such as executing specific software to perform specific calculations or tasks. In addition, the processing system 500 includes one or more input devices 504, such as a keyboard or a mouse, coupled to the processing circuitry 502 to allow an operator to interface with the processing system 500. Typically, the processing system 500 also includes one or more output devices 506 coupled to the processing circuitry 502, such as output devices typically including a printer and a video terminal. One or more data storage devices 508 are also typically coupled to the processing circuitry 502 to store data or retrieve data from external storage media (not shown). Examples of typical storage devices 508 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the invention. For example, the previously described embodiments of the invention combined one other redundancy scheme with a shared block of redundant memory, namely, a column decode shift scheme and a match and replace scheme. However, it will be appreciated that alternative redundancy schemes known or later developed can be combined and still remain within the scope of the present invention. A further example is the use of antifuses for programming the addresses of defective columns of memory. In alternative embodiments, fuses instead of antifuses are used. More generally, however, various different programmable devices could be used for programming the addresses of defective memory that are remapped to redundant memory. Accordingly, the invention is not limited except as by the appended claims.

What is claimed is:

1. A column redundancy system for a memory array having a plurality of memory sub-arrays including memory cells arranged in rows and columns of memory, the plurality of memory sub-arrays coupled to respective sense amplifiers, the column redundancy system comprising:
a plurality of sets of local redundant columns of memory, each set of local redundant columns of memory associated with a corresponding one of the plurality of memory sub-arrays, the columns of memory of the sets of local redundant columns of memory adapted to replace defective columns of memory of the respective memory sub-arrays; and
shared redundant memory having memory cells arranged in rows and columns of memory, the columns of memory of the shared redundant memory adapted to replace defective columns of memory of the plurality of memory sub-arrays, the shared redundant memory coupled to respective sense amplifiers that are separate from the respective sense amplifiers of the plurality of memory sub-arrays.

2. The column redundancy system of claim 1, further comprising a column decoder coupled to the plurality of sets of local redundant columns of memory and the shared redundant memory, the column decoder adapted to select a column of memory from the respective set of local redundant columns of memory or select a column of memory from the shared redundant memory in response to decoding a column address corresponding to a defective column of memory of the respective memory sub-array.

3. The column redundancy system of claim 2, further comprising a block of programmable elements coupled to the column decoder and having a plurality of programmable elements, the column decoder adapted to select a column of memory from the respective set of local redundant columns of memory or from the shared redundant memory in accordance with the programming of the plurality of programmable elements.

4. The column redundancy system of claim 1 wherein each of the sets of local redundant columns of memory comprises at least one redundant column of memory adjacent at least one of a first column of memory of the associated memory sub-array and a last column of memory of the associated memory sub-array.

5. The column redundancy system of claim 4, further comprising a column decoder coupled to the plurality of sets of local redundant columns of memory and the shared redundant memory, the column decoder adapted to decode column addresses for columns of memory between a defective column of memory and either the first or last column of memory, inclusive, to respective adjacent columns of memory.

6. The column redundancy system of claim 1 wherein each of the sets of local redundant columns of memory comprises a plurality of adjacent redundant columns of memory that are adjacent the associated memory sub-array.

7. The column redundancy system of claim 6, further comprising a column decoder coupled to the plurality of sets of local redundant columns of memory and the shared redundant memory, the column decoder adapted to remap column addresses corresponding to a defective column of memory of a memory sub-array to a redundant column of memory of the set of local redundant columns of memory associated with the memory sub-array.

8. A column redundancy system, comprising:
an array of primary memory having memory cells arranged in rows and columns and further having redundant columns of memory to which column addresses corresponding to defective columns of memory in the primary array can be mapped, the array of primary memory coupled to respective sense amplifiers;

an array of redundant memory having memory cells arranged in rows and columns of memory, the array of redundant memory coupled to respective sense amplifiers that are separate from the respective sense amplifiers of the array of primary memory;

a first set of I/O lines associated with the array of primary memory;

a second set of I/O lines associated with the array of redundant memory;

a multiplexer coupled to the first and second sets of I/O lines and configured to selectively couple the sets of I/O lines to an I/O bus; and a column decoder coupled to the array of primary memory, the array of redundant memory, and the multiplexer, the column decoder configured to map column addresses corresponding to defective columns of memory in the array of primary memory to the redundant columns of memory and control the multiplexer to couple the first set of I/O lines to the I/O bus or map column addresses corresponding to defective columns of memory in the array of primary memory to columns of memory of the array of redundant memory and control the multiplexer to couple the second set of I/O lines to the I/O bus.

9. The column redundancy system of claim 8, further comprising a block of programmable elements coupled to the column decoder and having a plurality of programmable elements, the column decoder further adapted to map column addresses corresponding to defective columns of memory in the array of primary memory to the redundant columns of memory and control the multiplexer to couple the first set of I/O lines to the I/O bus or map column addresses corresponding to defective columns of memory in the array of primary memory to columns of memory of the array of redundant memory and control the multiplexer to couple the second set of I/O lines to the I/O bus in accordance with the programming of the plurality of programmable elements.

10. The column redundancy system of claim 8 wherein the redundant columns of memory of the array of primary memory comprises at least one redundant column of memory adjacent at least one of a first column of memory and a last column of memory.

11. The column redundancy system of claim 10 wherein the column decoder comprises a column decoder further configured to decode column addresses for columns of memory between a defective column of memory and either the first or last column of memory, inclusive, to respective adjacent columns of memory.

12. The column redundancy system of claim 8 wherein the redundant columns of memory of the array of primary memory comprises a plurality of adjacent redundant columns of memory that are adjacent a first column of memory.

13. The column redundancy system of claim 12 wherein the column decoder comprises a column decoder further configured to map column addresses corresponding to a defective column of memory to a redundant column of memory.

14. A memory array, comprising:

a plurality of memory sub-arrays having memory cells arranged in rows and columns, each memory sub-array having at least one column of redundant memory to which a column address of a defective column of the memory sub-array can be mapped;

at least one redundant memory sub-array having memory cells arranged in rows and columns to which column addresses of defective columns of the plurality of memory sub-arrays can be mapped;

a plurality of sense amplifiers coupled to the columns of the plurality of memory sub-arrays and the columns of the redundant memory sub-array and configured to latch data of an activated row of the memory sub-arrays, each memory sub-array and redundant memory sub-array having sense amplifiers associated therewith;

a plurality of I/O lines on which data can be coupled, each memory sub-array and redundant memory sub-array having I/O lines associated therewith;

a multiplexer having first nodes coupled to the I/O lines and further having second nodes, the multiplexer configured to selectively couple a portion of the first nodes to the second nodes responsive to a control signal applied to a control node; and a column decoder coupled to the sense amplifiers and the control node of the multiplexer, the column decoder configured to selectively couple sense amplifiers associated with each memory sub-array and redundant memory sub-array to the respective associated I/O lines and further configured to generate the control signal for the multiplexer to select which of the I/O lines to be coupled to the second nodes.

15. The memory array of claim 14 wherein the columns of memory cells of each of the plurality of memory sub-arrays are arranged between a first column of memory and a last column of memory, and the column of redundant memory comprises at least one redundant column of memory adjacent the first column of memory and at least one redundant column of memory adjacent the last column of memory.

16. The memory array of claim 15 wherein the column decoder comprises a column decoder further configured to decode column addresses corresponding to a defective column of memory to a column of memory adjacent the defective column of memory.

17. The memory array of claim 14 wherein the columns of memory cells of each of the plurality of memory sub-arrays are arranged between a first column of memory and a last column of memory and the at least one column of redundant memory comprises a plurality of adjacent redundant columns of memory that are adjacent the first column of memory.

18. The memory array of claim 17 wherein the column decoder comprises a column decoder further configured to remap column addresses corresponding to a defective column of memory to a redundant column of memory.

19. The memory array of claim 14 wherein the plurality of memory sub-arrays comprises M memory sub arrays, wherein the at least one redundant memory sub-array comprises N redundant memory sub-arrays, and wherein the plurality of I/O lines comprises P I/O lines, $P=(M+N)\times Q$, where Q I/O lines are associated with each memory sub-array and redundant memory sub-array.

20. The memory array of claim 19 wherein the multiplexer comprises a multiplexer having P first nodes and $(M\times Q)$ second nodes.

21. The memory array of claim 14 wherein each of the memory sub-arrays comprises a memory sub-array having a plurality of primary columns of memory and a plurality of redundant columns of memory, and wherein each of the redundant memory sub-arrays comprises a plurality of columns of memory less than the plurality of primary columns of memory of each memory sub-array.

22. A memory device comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit, the memory-cell array having a plurality of memory sub-arrays including memory cells arranged in rows and columns of memory, the plurality of memory sub-arrays coupled to respective sense amplifiers; and
a column redundancy system, comprising:
a plurality of sets of local redundant columns memory, each set of local redundant columns of memory associated with a corresponding one of the plurality of memory sub-arrays, the columns of memory of the sets of local redundant columns of memory adapted to replace defective columns of memory of the respective memory sub-arrays; and
shared redundant memory having memory cells arranged in rows and columns of memory, the columns of memory of the shared redundant memory adapted to replace defective columns of memory of the plurality of memory sub-arrays, the shared redundant memory coupled to respective sense amplifiers that are separate from the respective sense amplifiers of the plurality of memory sub-arrays.

23. The memory device of claim 22 wherein the address decoder comprises a column decoder coupled to the plurality of sets of local redundant columns of memory and the shared redundant memory of the column redundancy system, the column decoder adapted to select a column of memory from the respective set of local redundant columns of memory or select a column of memory from the shared redundant memory in response to decoding a column address corresponding to a defective column of memory of the respective memory sub-array.

24. The memory device of claim 23, further comprising a block of programmable elements coupled to the column decoder and having a plurality of programmable elements, the column decoder adapted to select a column of memory from the respective set of local redundant columns of memory or from the shared redundant memory in accordance with the programming of the plurality of programmable elements.

25. The memory device of claim 22 wherein each of the sets of local redundant columns of memory of the column redundancy system comprises at least one redundant column of memory adjacent at least one of a first column of memory of the associated memory sub-array and a last column of memory of the associated memory sub-array.

26. The memory device of claim 25 wherein the address decoder comprises a column decoder coupled to the plurality of sets of local redundant columns of memory and the shared redundant memory of the column redundancy system, the column decoder adapted to decode column addresses for columns of memory between a defective column of memory of a memory sub-array and either the first or last column of memory, inclusive, to respective adjacent columns of memory.

27. The memory device of claim 22 wherein each of the sets of local redundant columns of memory of the column redundancy system comprises a plurality of adjacent redundant columns of memory that are adjacent the associated memory sub-array.

28. The memory device of claim 27 wherein the address decoder comprises a column decoder coupled to the plurality of sets of local redundant columns of memory and the shared redundant memory of the column redundancy system, the column decoder adapted to remap column addresses corresponding to a defective column of memory of a memory sub-array to a redundant column of memory of the set of local redundant columns of memory associated with the memory sub-array.

29. A memory device comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit, the memory-cell array having an array of primary memory having memory cells arranged in rows and columns and further having redundant columns of memory to which column addresses corresponding to defective columns of memory in the primary array can be mapped, the array of primary memory coupled to respective sense amplifiers; and
a column redundancy system, comprising:
an array of redundant memory having memory cells arranged in rows and columns of memory, the array of redundant memory coupled to respective sense amplifiers that are separate from the respective sense amplifiers of the array of primary memory;
a first set of I/O lines associated with the array of primary memory;
a second set of I/O lines associated with the array of redundant memory;
a multiplexer coupled to the first and second sets of I/O lines and configured to selectively couple the sets of I/O lines to an I/O bus; and
a column decoder coupled to the array of primary memory, the array of redundant memory, and the multiplexer, the column decoder configured to map column addresses corresponding to defective columns of memory in the array of primary memory to the redundant columns of memory and control the multiplexer to couple the first set of I/O lines to the I/O bus or map column addresses corresponding to defective columns of memory in the array of primary memory to columns of memory of the array of redundant memory and control the multiplexer to couple the second set of I/O lines to the I/O bus.

30. The memory device of claim 29, further comprising a block of programmable elements coupled to the column decoder of the column redundancy system and having a plurality of programmable elements, the column decoder further adapted to map column addresses corresponding to defective columns of memory in the array of primary memory to the redundant columns of memory and control the multiplexer to couple the first set of I/O lines to the I/O bus or map column addresses corresponding to defective columns of memory in the array of primary memory to columns of memory of the array of redundant memory and control the multiplexer to couple the second set of I/O lines to the I/O bus in accordance with the programming of the plurality of programmable elements.

31. The memory device of claim 29 wherein the redundant columns of memory of the array of primary memory comprises at least one redundant column of memory adjacent at least one of a first column of memory and a last column of memory.

32. The memory device of claim 31 wherein the column decoder of the column redundancy system comprises a column decoder further configured to decode column addresses for columns of memory between a defective column of memory and either the first or last column of memory, inclusive, to respective adjacent columns of memory.

33. The memory device of claim 29 wherein the redundant columns of memory of the array of primary memory comprises a plurality of adjacent redundant columns of memory that are adjacent a first column of memory.

34. The memory device of claim 33 wherein the column decoder of the column redundancy system comprises a column decoder further configured to map column addresses corresponding to a defective column of memory to a redundant column of memory.

35. A memory device comprising:
an address bus;
a control bus;
a data bus;
an address decoder coupled to the address bus;
a read/write circuit coupled to the data bus;
a control circuit coupled to the control bus;
a plurality of memory sub-arrays having memory cells arranged in rows and columns, each memory sub-array having at least one column of redundant memory to which a column address of a defective column of the memory sub-array can be mapped;
at least one redundant memory sub-array having memory cells arranged in rows and columns to which column addresses of defective columns of the plurality of memory sub-arrays can be mapped;
a plurality of sense amplifiers coupled to the columns of the plurality of memory sub-arrays and the columns of the redundant memory sub-array and configured to latch data of an activated row of the memory sub-arrays, each memory sub-array and redundant memory sub-array having sense amplifiers associated therewith;
a plurality of I/O lines on which data can be coupled, each memory sub-array and redundant memory sub-array having I/O lines associated therewith;
a multiplexer having first nodes coupled to the I/O lines and further having second nodes, the multiplexer configured to selectively couple a portion of the first nodes to the second nodes responsive to a control signal applied to a control node; and
a column decoder coupled to the sense amplifiers and the control node of the multiplexer, the column decoder configured to selectively couple sense amplifiers associated with each memory sub-array and redundant memory sub-array to the respective associated I/O lines and further configured to generate the control signal for the multiplexer to select which of the I/O lines to be coupled to the second nodes.

36. The memory device of claim 35 wherein the columns of memory cells of each of the plurality of memory sub-arrays are arranged between a first column of memory and a last column of memory, and the column of redundant memory comprises at least one redundant column of memory adjacent the first column of memory and at least one redundant column of memory adjacent the last column of memory.

37. The memory device of claim 36 wherein the column decoder comprises a column decoder further configured to decode column addresses corresponding to a defective column of memory to a column of memory adjacent the defective column of memory.

38. The memory device of claim 35 wherein the columns of memory cells of each of the plurality of memory sub-arrays are arranged between a first column of memory and a last column of memory and the at least one column of redundant memory comprises a plurality of adjacent redundant columns of memory that are adjacent the first column of memory.

39. The memory device of claim 38 wherein the column decoder comprises a column decoder further configured to remap column addresses corresponding to a defective column of memory to a redundant column of memory.

40. The memory device of claim 35 wherein the plurality of memory sub-arrays comprises M memory sub arrays, wherein the at least one redundant memory sub-array comprises N redundant memory sub-arrays, and wherein the plurality of I/O lines comprises P I/O lines, $P=(M+N) \times Q$, where Q I/O lines are associated with each memory sub-array and redundant memory sub-array.

41. The memory device of claim 40 wherein the multiplexer comprises a multiplexer having P first nodes and $(M \times Q)$ second nodes.

42. The memory device of claim 35 wherein each of the memory sub-arrays comprises a memory sub-array having a plurality of primary columns of memory and a plurality of redundant columns of memory, and wherein each of the redundant memory sub-arrays comprises a plurality of columns of memory less than the plurality of primary columns of memory of each memory sub-array.

43. A processor-based system, comprising:
a processor having a processor bus;
an input device coupled to the processor through the processor bus adapted to allow data to be entered into the computer system;
an output device coupled to the processor through the processor bus adapted to allow data to be output from the computer system; and
a memory device coupled to the processor bus adapted to allow data to be stored, the memory device comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit, the memory-cell array having a plurality of memory sub-arrays including memory cells arranged in rows and columns of memory, the plurality of memory sub-arrays coupled to respective sense amplifiers; and
a column redundancy system, comprising:
a plurality of sets of local redundant columns memory, each set of local redundant columns of memory associated with a corresponding one of the plurality of memory sub-arrays, the columns of memory of the sets of local redundant columns of memory adapted to replace defective columns of memory of the respective memory sub-arrays; and
shared redundant memory having memory cells arranged in rows and columns of memory, the columns of memory of the shared redundant memory adapted to replace defective columns of memory of the plurality of memory sub-arrays, the shared redundant memory coupled to respective sense amplifiers that are separate from the respective sense amplifiers of the plurality of memory sub-arrays.

44. The processor-based system of claim 43 wherein the address decoder comprises a column decoder coupled to the plurality of sets of local redundant columns of memory and the shared redundant memory of the column redundancy system, the column decoder adapted to select a column of memory from the respective set of local redundant columns of memory or select a column of memory from the shared redundant memory in response to decoding a column address corresponding to a defective column of memory of the respective memory sub-array.

45. The processor-based system of claim 44, further comprising a block of programmable elements coupled to the column decoder and having a plurality of programmable elements, the column decoder adapted to select a column of memory from the respective set of local redundant columns of memory or from the shared redundant memory in accordance with the programming of the plurality of programmable elements.

46. The processor-based system of claim 43 wherein each of the sets of local redundant columns of memory of the column redundancy system comprises at least one redundant column of memory adjacent at least one of a first column of memory of the associated memory sub-array and a last column of memory of the associated memory sub-array.

47. The processor-based system of claim 46 wherein the address decoder comprises a column decoder coupled to the plurality of sets of local redundant columns of memory and the shared redundant memory of the column redundancy system, the column decoder adapted to decode column addresses for columns of memory between a defective column of memory of a memory sub-array and either the first or last column of memory, inclusive, to respective adjacent columns of memory.

48. The processor-based system of claim 43 wherein each of the sets of local redundant columns of memory of the column redundancy system comprises a plurality of adjacent redundant columns of memory that are adjacent the associated memory sub-array.

49. The processor-based system of claim 48 wherein the address decoder comprises a column decoder coupled to the plurality of sets of local redundant columns of memory and the shared redundant memory of the column redundancy system, the column decoder adapted to remap column addresses corresponding to a defective column of memory of a memory sub-array to a redundant column of memory of the set of local redundant columns of memory associated with the memory sub-array.

50. A method for repairing a memory array having memory cells arranged in rows and columns of memory, the method comprising:
decoding column addresses corresponding to first defective columns of memory of the memory array to local redundant columns of memory;
decoding column addresses corresponding to second defective columns of memory of the memory array to shared redundant columns of memory;
coupling the local redundant columns of memory to an input/output (I/O) bus through a first set of sense amplifiers that are associated with the memory array; and
coupling the shared redundant columns of memory to the I/O bus through a second set of sense amplifiers that are separate from the first set of sense amplifiers.

51. The method of claim 50 wherein decoding the column address corresponding to second defective columns of memory of the memory array to shared redundant columns of memory comprises coupling the shared redundant columns of memory to the I/O bus and ignoring the second defective columns.

52. The method of claim 50 wherein decoding the column address corresponding to first defective columns of memory of the memory array to local redundant columns of memory comprises coupling the local redundant columns of memory to the I/O bus and ignoring the first defective columns.

53. The method of claim 50 wherein decoding column addresses corresponding to first defective columns of memory of the memory array to local redundant columns of memory comprises shifting column decoding of the first defective columns of memory to adjacent columns of memory, including at least one local redundant column of memory.

54. The method of claim 50 wherein decoding column addresses corresponding to first defective columns of memory of the memory array to local redundant columns of memory comprises matching the column addresses and replacing the first defective columns of memory with the local redundant columns of memory.

55. A column redundancy repair method for a memory array having a plurality of memory sub-arrays including memory cells arranged in rows and columns of memory, the method comprising:
providing each memory sub-array redundant column memory to which defective columns of memory of the respective memory sub-array can be mapped; and
providing an array of shared redundant column memory to which defective columns of memory of the memory sub-arrays can be mapped, wherein data is coupled to an input/output (I/O) bus from the redundant column memory through a first set of sense amplifiers that are associated with the plurality of memory sub-arrays and from the array of shared redundant column memory through a second set of sense amplifiers that are separate from the first set of sense amplifiers.

56. The method of claim 55 wherein providing each memory sub-array redundant column memory comprises providing at least one redundant column of memory adjacent at least one of a first column of memory of the memory sub-array and a last column of memory of the memory sub-array.

57. The method of claim 55 wherein providing each memory sub-array redundant column memory comprises providing a plurality of adjacent redundant columns of memory that are adjacent the first column of memory of the respective memory sub-array.

* * * * *